(12) United States Patent
Akiyama et al.

(10) Patent No.: US 7,972,937 B2
(45) Date of Patent: Jul. 5, 2011

(54) METHOD FOR PRODUCING SEMICONDUCTOR SUBSTRATE

(75) Inventors: Shoji Akiyama, Gunma (JP); Yoshihiro Kubota, Gunma (JP); Atsuo Ito, Gunma (JP); Makoto Kawai, Gunma (JP); Yuuji Tobisaka, Gunma (JP); Koichi Tanaka, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/230,984

(22) Filed: Sep. 9, 2008

(65) Prior Publication Data

US 2009/0111242 A1 Apr. 30, 2009

(30) Foreign Application Priority Data

Oct. 25, 2007 (JP) .................... 2007-277502

(51) Int. Cl.
*H01L 21/322* (2006.01)

(52) U.S. Cl. .................. 438/458; 257/E21.32

(58) Field of Classification Search .......... 438/458, 438/471, 477; 257/E21.122, E21.123, E21.32
See application file for complete search history.

(56) References Cited

U.S. PATENT DOCUMENTS

| 6,013,563 A * | 1/2000 | Henley et al. ............... 438/458 |
| 6,239,004 B1 * | 5/2001 | Aga et al. ................ 438/455 |
| 6,368,938 B1 | 4/2002 | Usenko |
| 6,372,609 B1 | 4/2002 | Aga et al. |
| 7,052,978 B2 * | 5/2006 | Shaheen et al. ........... 438/463 |
| 2003/0192469 A1 * | 10/2003 | Libbert et al. ............. 117/2 |
| 2004/0097055 A1 | 5/2004 | Henley et al. |
| 2008/0119028 A1 * | 5/2008 | Akiyama et al. ........... 438/458 |

FOREIGN PATENT DOCUMENTS

| EP | 1 045 448 A1 | 10/2000 |
| EP | 1 835 534 A1 | 9/2007 |
| JP | B2-3048201 | 6/2000 |

OTHER PUBLICATIONS

U.S. Appl. No. 11/984,184, Claims filed Nov. 14, 2007.*
A.J. Auberton-Herve et al., "Smart Cut Technology: Industrial Status of SOI Wafer Production and New Material Developments," *Electrochemical Society Proceedings*, vol. 99-3, 1999, pp. 93-106.
European Search Report for Application No. 08 01 6060, mailed Oct. 14, 2010.

* cited by examiner

*Primary Examiner* — Matthew Smith
*Assistant Examiner* — Daniel Shook
(74) *Attorney, Agent, or Firm* — Oliff & Berridge, PLC

(57) ABSTRACT

An object of the present invention is to provide a method by which bonding at a low temperature is possible and an amount of metal contaminants in an SOI film is decreased. An embodiment of the present invention is realized in the following manner. A single crystal silicon substrate 10 surface-activated by a plasma-treatment and a quartz substrate 20 are bonded together at a low temperature, to which an external impact is given to mechanically delaminate silicon film from a single crystal silicon bulk thereby obtaining a semiconductor substrate (SOI substrate) having a silicon film (SOI film) 12. Next, the SOI substrate is subjected to a heat-treatment at a temperature of 600° C. to 1250° C. so that metal impurities accidentally mixed into an interface of the SOI film and the quartz substrate and into the SOI film in such a step as a plasma-treatment are gettered to a surface region of the silicon film 12. Then, in the end, a surface layer (gettering layer) of the silicon film 12 of the SOI substrate after the heat-treatment is removed to finally prepare an SOI film 13 and a semiconductor substrate (SOI substrate) is obtained.

4 Claims, 2 Drawing Sheets

FIG.2
(A) 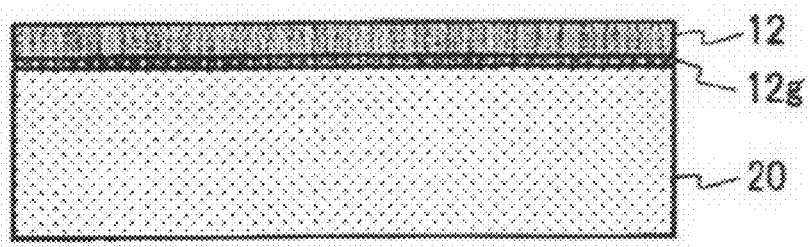
(B) 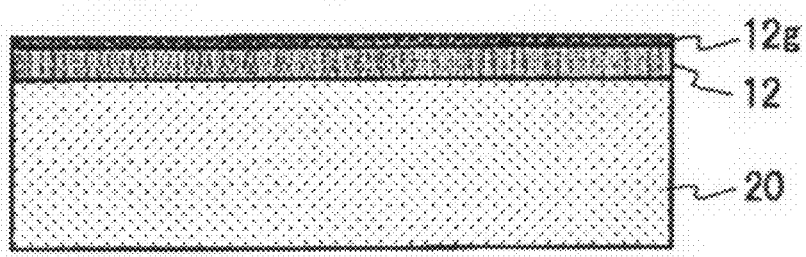
(C) 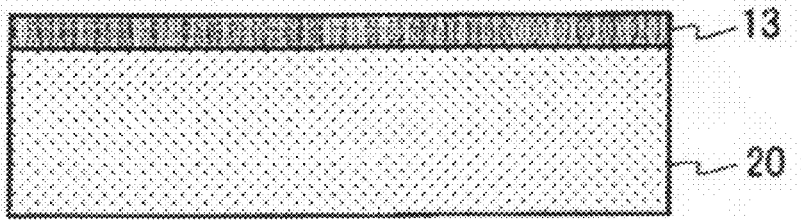

METHOD FOR PRODUCING SEMICONDUCTOR SUBSTRATE

BACKGROUND OF THE INVENTION

1. Field of the Invention

The present invention relates to a method for producing a semiconductor substrate having a silicon film on an insulator substrate.

2. Description of the Related Art

As a semiconductor substrate facilitating the enhancement of performance of a semiconductor device, an SOI (Silicon On Insulator) substrate has been drawing attention (see, for example, Japanese Patent No. 3048201 or A. J. Auberton-Herve et al., "SMART CUT TECHNOLOGY: INDUSTRIAL STATUS of SOI WAFER PRODUCTION and NEW MATERIAL DEVELOPMENTS" (Electrochemical Society Proceedings Volume 99-3 (1999) p. 93-106).). This is because it is made possible to decrease a parasitic capacitance, improve a performance speed, and reduce power consumption by adopting an SOI structure to bury an oxide film under a single crystal silicon thin film.

However, because a so-called "gettering effect", which is generally utilized in a bulk silicon substrate, can not be expected from such an SOI substrate, there is a problem in that the SOI substrate is quite susceptible to various metal contaminations in the production step thereof.

Such being the case, measures have conventionally been taken against impurities by improving the cleanliness of a process equipment or an environment. However, when a process of performing a plasma-treatment is adopted to secure a bonding strength in the case of bonding an insulator substrate and a silicon substrate at a low temperature, metal impurities are prone to accumulate in a bonding interface at a high density with the progress of the plasma-treatment. Therefore the mere clean-up of the plasma-treatment environment is not enough as the measures against the metal contaminations.

SUMMARY OF THE INVENTION

In view of the above-explained problem, it is an object of the present invention to provide a method by which bonding at a low temperature is possible and, what is more, the amount of the metal contaminants in an SOI film of an obtained SOI substrate is decreased.

To achieve this object, a method for producing a semiconductor substrate according to the present invention comprises the steps of: ion-implanting for forming a hydrogen-ion implanted layer to a main surface of a silicon substrate, a surface treatment for performing a plasma-treatment on at least one of a main surface of an insulator substrate and the main surface of the silicon substrate, bonding the main surface of the insulator substrate and the main surface of the silicon substrate, delaminating for mechanically delaminating a silicon thin film from the silicon substrate of the bonded substrate to prepare an SOI substrate having a silicon film on the main surface of the insulator substrate, a heat-treatment of the SOI substrate at a temperature of 600° C. to 1250° C., and removing a surface layer of the silicon film of the SOI substrate after the heat-treatment.

An atmosphere in the step of the heat-treatment is, for example, an inert gas containing as a main component at least one of a nitrogen gas, an argon gas, and a helium gas.

An atmosphere in the step of the heat-treatment may be, for example, a mixed gas of an oxidizing gas and an inert gas containing as a main component at least one of a nitrogen gas, an argon gas, and a helium gas.

In the present invention, a step of removing an oxide film on the silicon film may be provided after the step of the heat-treatment.

Furthermore, a step of a heat-treatment of the bonded substrate at a temperature of 100 to 300° C. may be provided before the step of delaminating.

The insulator substrate used in the present invention is, for example, a high resistivity silicon substrate, a silicon substrate having an oxide film, a quartz substrate, a sapphire substrate, a silicon carbide substrate and the like.

In the present invention, a silicon substrate surface-activated with a plasma-treatment and an insulator substrate are bonded at a low temperature, a silicon film is mechanically delaminated by giving an external impact to the bonded substrate thereby obtaining an SOI film on the insulator substrate, and the SOI substrate is subjected to a heat-treatment at a temperature of 600° C. to 1250° C. so that metal impurities accidentally mixed into an interface of the SOI film and the insulator substrate and into the SOI film in such a step as the plasma-treatment are gettered to a surface region of the silicon film. By using such a technique, it is made possible to perform bonding at a low temperature and decrease the amount of metal contaminants in the SOI film.

BRIEF DESCRIPTION OF THE DRAWINGS

FIG. 2 is view for conceptually explaining how metal impurities are gettered to the mechanically delaminated surface (SOI film surface) of the silicon film.

DETAILED DESCRIPTION OF THE PREFERRED EMBODIMENTS

Figure 1:
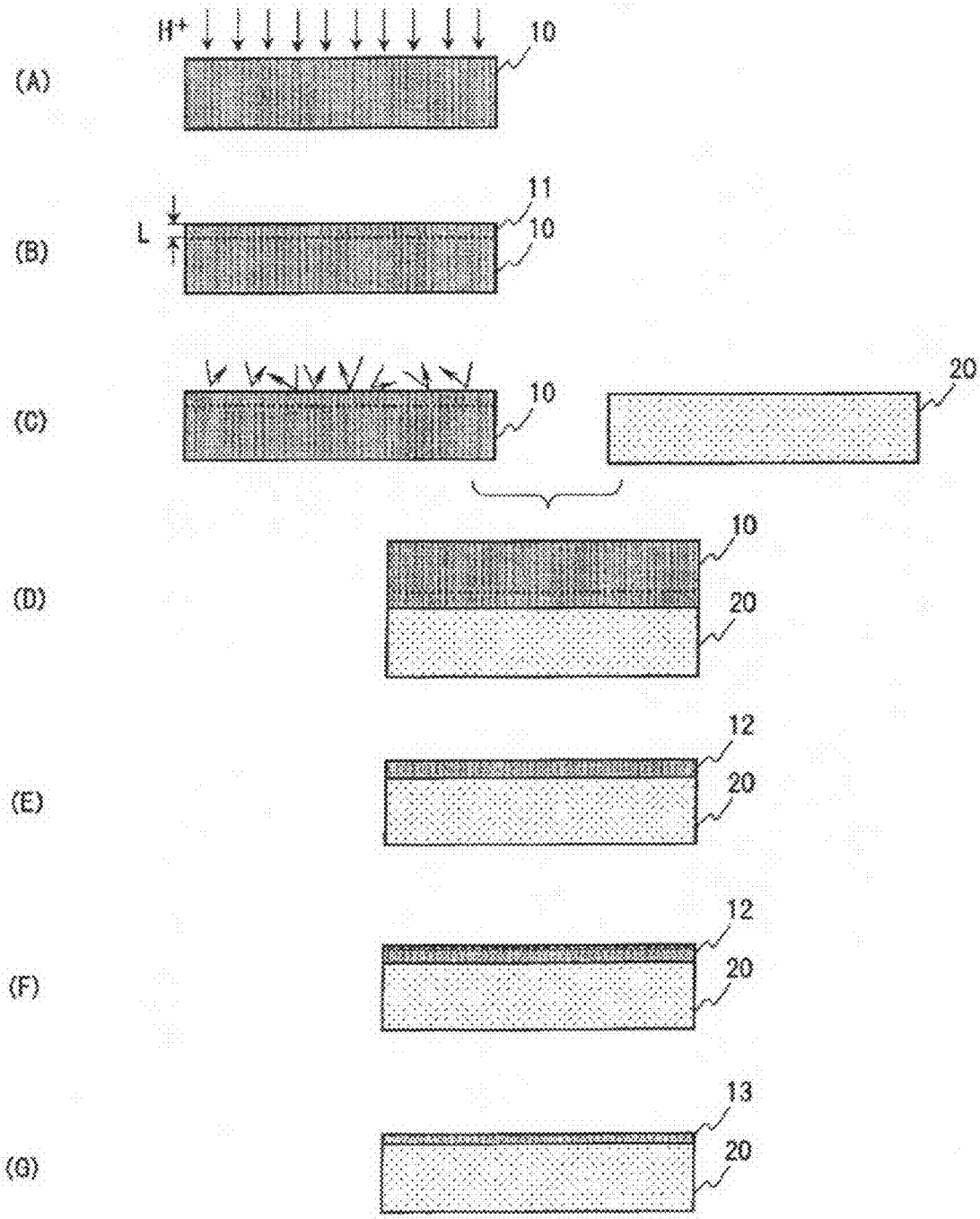
FIG. 1 is view for explaining a process example of a method for producing a semiconductor substrate according to the present invention.

Hereinafter, a method for producing a semiconductor substrate according to the present invention will be explained based on Example. It is to be noted that, although an insulator substrate will be explained as a quartz substrate in this Example, the insulator substrate used in the present invention may be a high resistivity silicon substrate, a silicon substrate having an oxide film, a sapphire substrate, a silicon carbide substrate and the like.

FIG. 1 is view for explaining a process example of a method for producing a semiconductor substrate according to the present invention. A silicon substrate 10 shown in FIG. 1(A) is generally a single crystal silicon substrate and a support substrate is a quartz substrate 20. Here the single crystal silicon substrate 10 is, for example, a generally commercially available silicon substrate grown based on a CZ method (Czochralski method) and an electrical characteristic value such as a conductivity type and a resistivity, a crystal orientation, or a crystal diameter thereof may be appropriately selected in dependence on a design value or a process of a device adopting an SOI substrate produced by the method according to the present invention or a display area of a device to be manufactured. It is to be noted that an oxide film may be formed in advance on a surface (bonding surface) of the single crystal silicon substrate 10 by, for example, thermal oxidation or the like.

The single crystal silicon substrate 10 and the quartz substrate 20 to be bonded have the same diameter. When the same orientation flat (OF) as an OF provided on the single-crystal silicon substrate 10 is likewise provided on the quartz substrate 20 and these substrates are bonded while matching these OFs with each other, this will be convenient for a subsequent device formation process.

First, hydrogen ions are implanted to a surface of the single crystal silicon substrate 10 under the condition that the temperature of the silicon substrate 10 is maintained at a temperature of not higher than 400° C. (400° C. or lower) (FIG. 1(A)). This ion-implanted surface serves as a joint surface (a bonding surface) at a later step. By implanting hydrogen ions, an ion-implanted layer 11 is formed uniformly at a predetermined depth (an average ion implantation depth, L) near the surface of the single crystal silicon substrate 10 (FIG. 1(B)). When the temperature of the silicon substrate 10 in the step of ion-implanting is maintained at 400° C. or lower, the occurrence of a so-called microcavity is remarkably suppressed. It is to be noted that the temperature of the single crystal silicon substrate 10 at the time of implanting hydrogen ions is set to 200° C. to 400° C. inclusive in this Example.

As a dose amount at the time of implanting hydrogen ions, an appropriate value is selected from the range of, for example, $1 \times 10^{16}$ to $4 \times 10^{17}$ atoms/cm$^2$ in accordance with a specification and the like of the SOI substrate. It is to be noted that a dose amount of more than $1 \times 10^{17}$ atoms/cm$^2$ has conventionally been considered to bring about surface roughness of a resultant SOI layer, thus the dose amount is generally set to approximately $7 \times 10^{16}$ atoms/cm$^2$. However, the investigation of the present inventors has revealed that the cause of the surface roughness of the SOI layer occurring under the above-mentioned ion-implanting condition considered to occur in a conventional method lies not in a dose amount of hydrogen ions itself but in a diffusion phenomenon of hydrogen generating in a step of heat-treatment at a relatively high temperature (e.g. 500° C.) adopted to obtain an SOI layer by delaminating a silicon thin film.

Therefore in a case where an integrated low-temperature process including a step of implanting hydrogen ions is adopted as the present invention, not only the step of implanting hydrogen ions but also a step of delaminating is carried out at a low temperature. Thus the diffusion of hydrogen atoms in the step of delamination-treatment is remarkably suppressed, with the result that no surface roughness of the SOI layer occur even if hydrogen-ion implantation is performed at a high dose amount. The present inventors investigated the influence on the surface roughness of the SOI layer by performing hydrogen-ion implantation at various dose amounts. As a result, no surface roughness was observed at least to a dose amount of $4 \times 10^{17}$ atoms/cm$^2$ as far as the delamination of the silicon thin film is performed by a heat-treatment at a low temperature of 400° C. or lower.

A depth of the ion-implanted layer 11 from a surface of the single crystal silicon substrate 10 (an average ion implantation depth, L) is controlled by an acceleration voltage at the time of ion implantation and is determined in dependence on a thickness of an SOI layer to be delaminated. For example, an average ion implantation depth, L is set at 0.5 μm or less and an acceleration voltage is set at 50 to 100 keV. It is to be noted that, as is usually conducted in order to suppress channeling of the implanted ions in a process of implanting the ions into a silicon crystal, an insulator film such as an oxide film may be formed in advance on an ion-implanted surface of the single crystal silicon substrate 10 to perform ion implantation through the insulator film.

After the hydrogen-ion implantation, a plasma-treatment is performed on the joint surface of the single crystal silicon substrate 10 aiming at surface cleaning, surface activation and the like (FIG. 1(C)). It is to be noted that this plasma-treatment is performed with the intention of removing an organic substance on the surface to serve as a joint surface or increasing hydroxyl groups on the surface to attain surface activation. Therefore, the plasma-treatment may be performed on the joint surfaces of both the single crystal silicon substrate 10 and the quartz substrate 20 or only on the joint surface of the quartz substrate 20. In other words, it is fine if the plasma-treatment is performed on the joint surface of any one of the single crystal silicon substrate 10 and the quartz substrate 20.

In this plasma treatment, a single crystal silicon substrate and/or a quartz substrate having the surface cleaned in advance by RCA cleaning or the like is mounted on a sample stage in a vacuum chamber, a gas for plasma is introduced into the vacuum chamber so that a predetermined degree of vacuum is attained, and then the plasma treatment is performed. It is to be noted that, as the gas type for plasma used in this process, there is an oxygen gas, a hydrogen gas, an argon gas, a mixed gas of these gases, or a mixed gas of a hydrogen gas and a helium gas. After introducing the gas for plasma, a high-frequency plasma having a power of approximately 100 W is generated, the treatment is performed with respect to the surface of the single crystal silicon substrate and/or the quartz substrate for approximately 5 to 10 seconds, and then the treatment is terminated.

The surfaces of the single crystal silicon substrate 10 and the quartz substrate 20, upon which the above-mentioned surface treatment is performed, are pressed against each other to be bonded (FIG. 1(D)). Because at least one surface (joint surface) of the single crystal silicon substrate 10 and the quartz substrate 20 is subjected to a surface treatment based on the plasma-treatment to be activated as described above, a bonding strength which is enough to resist a mechanical delamination or a mechanical polishing in a later step can be obtained even when they are pressed (bonded) at room temperature.

It is to be noted that, following the step of bonding in FIG. 1(D) and before a step of delaminating, a step of a heat-treatment at a temperature of 100 to 300° C. may be provided in the state of the single crystal silicon substrate 10 and the quartz substrate 20 being bonded together. This heat treatment step is mainly intended to obtain an effect increasing the bonding strength of the single crystal silicon substrate 10 and the quartz substrate 20.

A main reason for keeping a temperature of 300° C. or lower in the step of the heat-treatment lies not only in the suppression of the occurrence of the "microcavity" as described above but also in the consideration on a thermal expansion coefficient difference between the single crystal silicon and the quartz, a strain amount due to this thermal expansion coefficient difference, and a relationship between this strain amount and thicknesses of the single crystal silicon substrate 10 and the quartz substrate 20.

It is to be noted that, there is also expected from the heat-treatment an additional effect of weakening the chemical bonds of silicon atoms in the ion-implanted layer 11 by causing thermal stress resulting from the difference between the coefficients of thermal expansion of the single crystal silicon substrate 10 and the quartz substrate 20 in dependence on the amount of hydrogen ions to be implanted.

Following such a treatment, a silicon film is mechanically delaminated from a bulk of the single crystal silicon by giving an external impact to the bonded substrate based on a certain method to obtain a semiconductor substrate (a SOI substrate) having a silicon film (a SOI film) 12 on the quartz substrate 20 (FIG. 1(E)). It is to be noted that, there are several methods for giving an external impact to delaminate the silicon film (the SOI film) 12 but the delamination in this Example is carried out without heating.

By measuring an region of 10 μm×10 μm on a surface of the thus obtained SOI film after the delamination by an atomic force microscope (AFM), it was found that the average value of RMS was 5 nm, which was excellent. Furthermore, the variation in a substrate plane of the SOI film (PV "peak to valley") was 4 nm or less. The reason for being able to obtain a relatively smooth delaminated surface lies in a delamination mechanism different from that of conventional thermal delamination.

Next, the obtained SOI substrate is subjected to a heat-treatment at a temperature of 600° C. or higher and 1250° C. or lower (FIG. 1(F)). The lowest limit temperature of 600° C. was selected because a gettering effect can not be expected at a temperature below this due to the difficulty for metal impurities to diffuse. The highest limit temperature of 1250° C. was selected considering the softening of quartz materials used for the heat-treatment. A temperature of 1000° C. was selected in this Example, which is lower than the transition temperature of a quartz substrate (1090° C.).

During the heat-treatment, metal impurities accidentally mixed into an interface of the SOI film and the insulator substrate and into the SOI film in such a step as the plasma-treatment are gettered to a surface region of the silicon film 12. The gettering source on this occasion is a lattice distortion of the mechanically delaminated surface (the SOI film surface) of the silicon film 12. When mechanically delaminating a silicon film from a bulk of the single crystal silicon, the delaminated surface is in a state where a silicon crystal lattice is distorted and this lattice distortion of the SOI film surface is used as the gettering source in the present invention.

Then, finally there is removed a surface layer (a gettering layer) of the silicon film 12 of the SOI substrate after the heat-treatment mentioned above to prepare an SOI film 13 as a final product and a semiconductor substrate (a SOI substrate) is obtained (FIG. 1(G)).

FIG. 2 is view for conceptually explaining how metal impurities are gettered to the mechanically delaminated surface (the SOI film surface) of the silicon film 12. In the state immediately after bonding, metal impurities have accumulated unavoidably and accidentally to a bonding interface at a high density because of a plasma-treatment performed for bonding at a low temperature (12g of FIG. 2(A)).

When the SOI substrate in this state is subjected to a heat-treatment at a temperature of 600° C. or more, metals are diffused in the SOI film 12 to be gettered to an SOI film surface where lattice distortion is relatively large (FIG. 2(B)).

When an adequate thickness of a surface region of the SOI film 12 (e.g. 0.1 μm) is removed in this state, an SOI substrate having a low level of metal impurities can be obtained (FIG. 2(C)). It is to be noted that this removal may be performed by polishing, etching and the like.

An atmosphere in which a heat-treatment for such gettering is performed may be an inert gas (for example, an inert gas containing as a main component at least one of a nitrogen gas, an argon gas, and a helium gas) or a mixed gas of such an inert gas and an oxidizing gas.

When the latter atmosphere is selected, metal impurities can be captured in an oxide film formed during the heat-treatment and in an interface of silicon and the oxide film and the same effect as a so-called "sacrificial oxidation" can be expected. It is to be noted that, on this occasion, the oxide film formed on the SOI film 12 is removed by such as a treatment with a hydrofluoric acid after the step of the heat-treatment.

The present invention provides a method by which bonding at a low temperature is possible and an amount of metal contaminants in an SOI film of the obtained SOI substrate is decreased.

What is claimed is:

1. A method for producing a semiconductor substrate, comprising the steps of:
    ion-implanting for forming a hydrogen-ion implanted layer to a main surface of a silicon substrate,
    a surface treatment for performing a plasma-treatment on at least one of a main surface of an insulator substrate, which is any one of a high resistivity silicon substrate, a silicon substrate having an oxide film, a quartz substrate, a sapphire substrate, and a silicon carbide substrate, and the main surface of the silicon substrate,
    bonding the main surface of the insulator substrate and the main surface of the silicon substrate,
    delaminating for mechanically delaminating a silicon thin film from the silicon substrate of the bonded substrate to prepare an SOI substrate having a silicon film on the main surface of the insulator substrate,
    heat-treating the SOI substrate at a temperature of 600° C. to 1250° C., wherein an atmosphere in the heat-treatment is a mixed gas of an oxidizing gas and an inert gas containing as a main component at least one of a nitrogen gas, an argon gas, and a helium gas, thereby gettering metal impurities to a surface region of the silicon film of the SOI substrate, and
    removing a surface layer of the silicon film of the SOI substrate after the heat-treatment.

2. The method for producing a semiconductor substrate according to claim 1, wherein
    a step of removing an oxide film on the silicon film is provided after the step of the heat-treatment.

3. The method for producing a semiconductor substrate according to claim 2, wherein
    a step of a heat-treatment of the bonded substrate at a temperature of 100 to 300° C. is provided before the step of delaminating.

4. The method for producing a semiconductor substrate according to claim 1, wherein
    a step of a heat-treatment of the bonded substrate at a temperature of 100 to 300° C. is provided before the step of delaminating.

* * * * *